United States Patent
Onodera et al.

(10) Patent No.: US 6,600,217 B2
(45) Date of Patent: Jul. 29, 2003

(54) MOUNTING SUBSTRATE AND MOUNTING METHOD FOR SEMICONDUCTOR DEVICE

(75) Inventors: Masanori Onodera, Kawasaki (JP); Shinsuke Nakajyo, Kawasaki (JP); Masamitsu Ikumo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 137 days.

(21) Appl. No.: 09/731,804

(22) Filed: Dec. 8, 2000

(65) Prior Publication Data

US 2001/0013641 A1 Aug. 16, 2001

(30) Foreign Application Priority Data

Feb. 14, 2000 (JP) ........................................ 2000-035952

(51) Int. Cl.[7] .................. H01L 23/495; H01L 23/02; H01L 23/48; H01L 23/52; H01L 29/40; H01L 23/29; H01L 23/544

(52) U.S. Cl. .................. 257/667; 257/668; 257/680; 257/774; 257/773; 257/797; 257/778; 257/789; 257/795; 257/738; 257/737

(58) Field of Search .................. 257/779, 753, 257/732, 731, 730, 710, 701, 684, 678, 783, 780, 667, 774, 797, 680, 668, 773, 778, 789, 795, 738, 737

(56) References Cited

U.S. PATENT DOCUMENTS 5,920,116 A  * 7/1999 Umehara et al. ........... 257/669

6,506,257 B2 * 1/2003 Horiguchi et al. ........... 118/725

FOREIGN PATENT DOCUMENTS

| JP | 06-268110 | * | 9/1994 | .................... 23/34 |
| JP | 07045641 |  | 2/1995 |  |
| JP | 07-161594 |  | 6/1995 |  |
| JP | 407161594 | * | 6/1995 | ...................... 21/2 |
| JP | 09-232409 | * | 9/1997 | .................... 21/68 |
| JP | 09289227 |  | 11/1997 |  |
| JP | 10-178048 |  | 6/1998 |  |
| JP | 10178048 | * | 6/1998 | .................... 23/12 |

* cited by examiner

Primary Examiner—Nathan J. Flynn
Assistant Examiner—Victor A. Mandala, Jr.
(74) Attorney, Agent, or Firm—Staas & Halsey LLP

(57) ABSTRACT

A mounting substrate and related mounting method for a semiconductor device. The mounting substrate includes a mounting area to which the semiconductor device is to be mounted and fixed by an adhesive, a peripheral channel formed in the mounting substrate so as to surround the mounting area, and radial channels extending radially from the center towards the periphery of the mounting area. An adhesive is applied at least to either the center of the mounting surface of the semiconductor device or the center of the mounting area of the mounting substrate. The semiconductor device is placed on the mounting area and the adhesive flows outwardly along the radial channels, with the adhesive then being cured. The peripheral channel provides control of the amount of adhesive which flows to the outside of the semiconductor device and the mounting area. The adhesive overflow can be adjusted such that adhesive climbs up the sides of the semiconductor device but not reach the upper surface of the device.

10 Claims, 4 Drawing Sheets

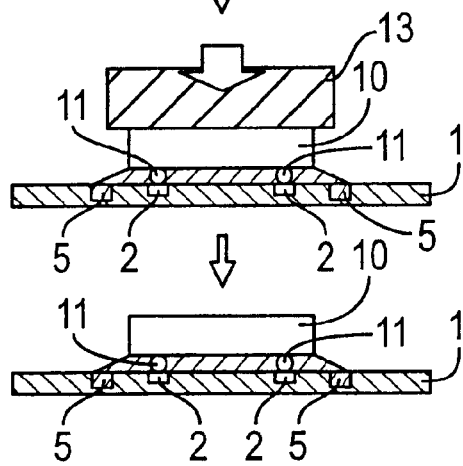
FIG. 4A
FIG. 4B
FIG. 4C
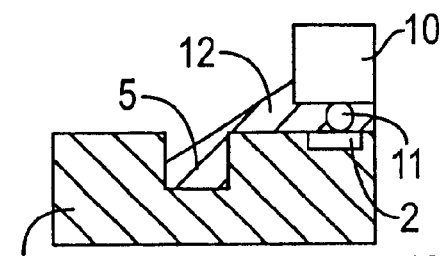
FIG. 5A
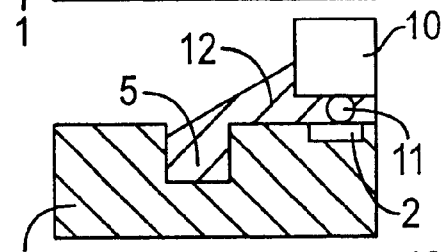
FIG. 5B
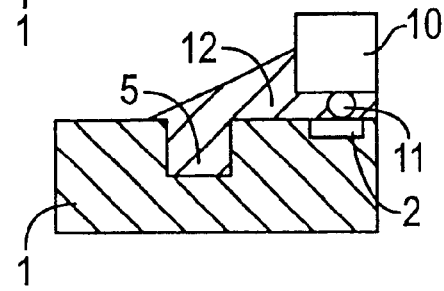
FIG. 5C

MOUNTING SUBSTRATE AND MOUNTING METHOD FOR SEMICONDUCTOR DEVICE

CROSS-REFERENCE TO RELATED APPLICATION

This application is based upon and claims priority of Japanese Patent Application No. 2000-35952 filed on Feb. 14, 2000, the contents being incorporated herein by reference.

BACKGROUND OF THE INVENTION

1. Field of the Invention

The present invention relates to a mounting substrate and a mounting method for a semiconductor device, and more particularly relates to a mounting substrate and a mounting method whereby a semiconductor device is mounted by means of a liquid adhesive.

In recent years, demand for the miniaturization of electronic devices has led to efforts to achieve a compact mounting substrate on which a semiconductor device or the like is mounted. Achievement of a compact surface area at the mounting area for a semiconductor device on a mounting substrate is acceptable for compacting a mounting substrate, but flip-chip mounting wherein a bare chip is mounted on a mounting substrate without modification has been used as one means to achieve a compact surface area at a mounting area. In flip-chip mounting, an adhesive is generally used to affix a bare chip to a mounting substrate.

2. Description of the Related Art

In one method of flip-chip mounting, an adhesive is generally supplied between the semiconductor device and the mounting substrate in a film-form or paste-form state. The supplied adhesive is liquefied by heating, flows between the semiconductor device and mounting substrate, and fills the space uniformly. The adhesive then cures, and the semiconductor device is affixed to the mounting substrate.

In another method of flip-chip mounting, a liquid adhesive is painted on the mounting area of a mounting substrate or the mounting surface of a semiconductor device, the semiconductor device is placed on the mounting area to force the liquid adhesive to travel over the entire surface of the semiconductor device, and then heat-curing is performed.

Adoption of either of the above-noted methods requires that the adhesive is forced to travel over the entire surface of the semiconductor device, and the entire mounting surface of the semiconductor device is wet by the liquid adhesive so that the semiconductor device is affixed reliably to the mounting substrate.

When a film-form adhesive is used, the quantity of adhesive and the shape of the area where the adhesive is supplied can be specified with comparative ease. However, a film-form adhesive is more expensive than a paste-form adhesive.

A paste-form adhesive is inexpensive, but a problem exists in that the adhesive becomes liquefied and its shape is not uniform after curing. Thus, if there is too much adhesive, the adhesive may spread outside of the mounting area upon liquefaction. The mounting area may be enlarged peremptorily in order to allow spreading of the adhesive, but this practice may result in a mounting area of larger surface area than required for mounting, reversing efforts to achieve a compact mounting substrate. If there is too little adhesive, the adhesive may not reach all parts of the adhesion surface.

Likewise, if the adhesive is supplied unevenly to local areas, or if flow is not uniform when the adhesive is liquefied, the adhesive may spread outside of the mounting area in certain locations, or the adhesive may not reach certain areas.

Problems such as those described above are similar even when a liquid adhesive is used at the outset.

In order to solve such problems, a structure has been proposed wherein a strip-shaped projection is furnished peripheral to the mounting area of a mounting substrate so that a liquid adhesive does not spread beyond that mounting area. A structure has also been proposed wherein, in lieu of projections, a channel is furnished peripheral to the mounting area, and any outflow of excess liquid adhesive accumulates within the channel.

Methods for supplying an adhesive to a mounting area include a method wherein a semiconductor device is placed on the mounting area of a mounting substrate, and a liquid adhesive is poured between the semiconductor device and the mounting substrate from a side area. When such a method is adopted, if the flow of the adhesive is poor, the adhesive does not quickly reach the side opposite the side of entry. Thus, a structure has also been proposed wherein a channel is furnished at the mounting area of a mounting substrate, and an adhesive thereby flows well from the side of entry to the opposite side. However, the channel in this structure is a channel furnished for inflow of an adhesive from a side area, and this channel cannot be applied in a method wherein an adhesive is previously deposited between a semiconductor device and a mounting substrate.

SUMMARY OF THE INVENTION

An object of the present invention is to provide a semiconductor mounting substrate and mounting method preventing outflow of excess adhesive during mounting of a semiconductor device.

Another object of the present invention is to provide a semiconductor mounting substrate and mounting method such that the flow of a liquid adhesive is controlled and the adhesive thereby travels over the entire mounting surface.

In accordance with the invention, a first embodiment is directed to a mounting substrate having a mounting area to which a semiconductor device is mounted and affixed by an adhesive, a peripheral channel formed in the mounting substrate so as to surround the mounting area, and a radial channel extending radially from the center of said mounting area towards the periphery, the tip of which extends to the outside of the mounting area.

According to this embodiment of the invention, there is provided a radial channel which extends radially from the center of the mounting area. Thus, an adhesive supplied at the center of the mounting area is guided in the radial channel and flows toward the periphery of the mounting area. The adhesive flows completely and uniformly from the center toward the periphery, and disparities in adhesive deposition are eliminated.

According to this embodiment of the invention, a peripheral channel is furnished at the tip area of the radial channel. Thus, adhesive flowing out from a semiconductor device is contained in the peripheral channel and prevented from further outflow to the outside. A certain amount of the outflowing adhesive is reserved in the peripheral channel. Thus, a certain margin is imparted to the amount of adhesive supplied, and even if the amount of adhesive supplied is inconsistent, adhesive is forced to travel over the entire mounting area, and excess outflow of adhesive is nonetheless prevented.

Because the adhesive cures without further change after it is deposited in the radial channel, the adhesive force of side wall portions of the radial channel is increased. Therefore, the anchoring effect of adhesive which has cured within the radial channel increases the adhesive force between the adhesive and the mounting substrate. More reliable mounting without peeling of the adhesive is thereby achieved.

In accordance with the invention, a second embodiment is directed to a mounting method for mounting a semiconductor device on the mounting substrate of the first embodiment wherein an adhesive is applied to at least either the center of the mounting surface of the semiconductor device or the center of the mounting area of the mounting substrate, wherein the semiconductor device is placed on the mounting area, and wherein the adhesive is cured.

According to this embodiment of the invention, an adhesive is deposited in a radial channel and made to flow uniformly to the periphery of a mounting area simply by supplying an adhesive at the center of the mounting area. As a result, the adhesive is made to travel over the entire mounting surface of the semiconductor device, and highly reliable mounting is achieved.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIGS. 4A–4C are schematic views illustrating a method wherein a semiconductor device is mounted on a mounting substrate according to a first embodiment of the present invention.

FIGS. 5A–5C are cross-sectional views illustrating the effect of a peripheral channel in a mounting substrate according to a first embodiment of the present invention.

DESCRIPTION OF THE PREFERRED EMBODIMENTS

Figure 1:
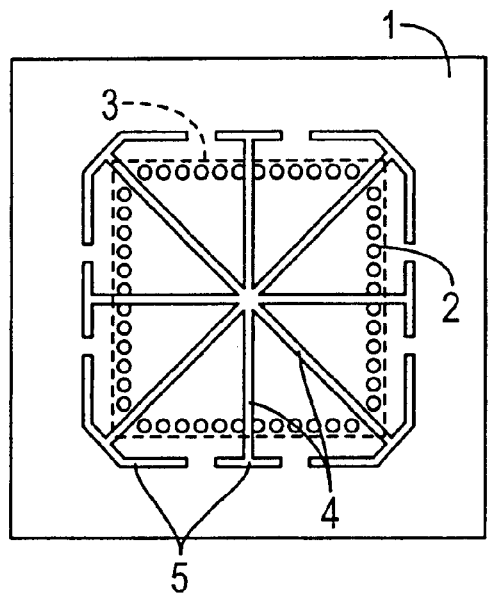
FIG. 1 is plane view of a mounting substrate according to a first embodiment of the present invention.

Reference will now be made in detail to the preferred embodiments of the present invention, examples of which are illustrated in the accompanying drawings, wherein like reference numerals refer to like elements throughout.

FIG. 1 is a plane view of a mounting substrate according to a first embodiment of the present invention. As shown in FIG. 1, the mounting substrate 1 is furnished with lands 2 to which electrodes of a semiconductor device (not illustrated) are bonded. The semiconductor device is approximately square in shape and conforms approximately to the shape and dimensions of a mounting area 3 depicted by the dotted lines in FIG. 1.

A number of radial channels 4 are formed in the mounting area 3 of the mounting substrate 1. The radial channels 4 are formed so as to extend radially from the center of the mounting area 3 towards the periphery of the mounting area 3. As shown in FIG. 1, a total of eight radial channels 4 are formed along vertical, horizontal, and diagonal lines in the mounting area 3.

A peripheral channel 5 is formed at the periphery of the mounting area 3. The peripheral channel 5 is divided into a number of short portions, and each portion is connected to a corresponding radial channel 4. The radial channels 4 extending vertically and horizontally are connected so as to lie at right angles to the peripheral channel 5. In order to connect the peripheral channel 5 and the radial channels 4 extending along the diagonals in a perpendicular fashion, the corner portions of the peripheral channel 5 located atop the diagonals are formed so as to extend in a direction perpendicular to the corresponding radial channel 4.

Figure 2:
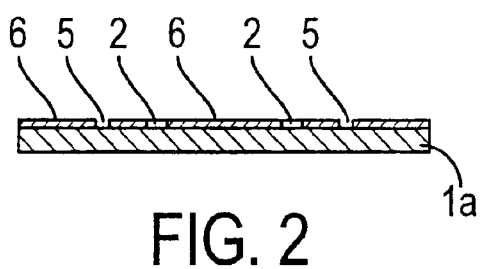
FIG. 2 is a cross-sectional view illustrating a structure and method employed to form a peripheral channel and a radial channel on a mounting substrate according to a first embodiment of the present invention.
Figure 3:
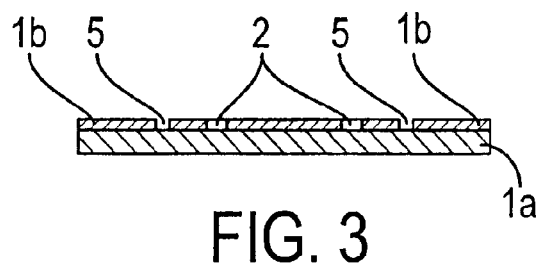
FIG. 3 is a cross-sectional view illustrating another structure and method employed to form a peripheral channel and a radial channel on a mounting substrate according to a first embodiment of the present invention.

FIG. 2 and FIG. 3 illustrate a structure and method whereby a radial channel 4 and a peripheral channel 5 are formed on the surface of a mounting substrate 1. FIG. 2 and FIG. 3 depict only a peripheral channel 5, but a radial channel 4 is also formed in the structure and by a similar method.

The example shown in FIG. 2 is one in which a solder resist layer 6 having a predetermined, uniform thickness is formed on the substrate proper 1a of a mounting substrate 1, and a radial channel 4 and a peripheral channel 5 are formed by etching and thereby removing portions of the solder resist layer 6 corresponding to the radial channel 4 and the peripheral channel 5.

The example shown in FIG. 3 is one in which a sheet 1b is produced from the same material as a substrate proper 1a, has a predetermined thickness, and is attached to a surface of the substrate proper 1a. Long, narrow slits corresponding to a radial channel 4 and a peripheral channel 5 have been formed in advance in the sheet 1b, and a radial channel 4 and a peripheral channel 5 are formed by attaching the sheet 1b to the substrate proper 1a.

Because the sheet 1b is produced from the same material as the substrate proper 1a, their coefficients of linear expansion are equivalent. Thus, any thermal expansion or contraction of the mounting substrate 1 caused by changes in ambient temperature does not produce heat stress between the sheet 1b and the substrate proper 1a, and the mounting substrate 1 is rendered strong against ambient temperature change.

The reason that the peripheral channel 5 is divided as shown in FIG. 1 is to facilitate manufacture, but a continuous channel surrounding the mounting area 3 may also be formed if manufacture is possible. In other words, the reason is that formation of a radial channel 4 and a peripheral channel 5 by etching as in the example in FIG. 2 would require masking that preserves portions corresponding to a radial channel 4 and a peripheral channel 5, and when a radial channel 4 and a peripheral channel 5 are continuous, a mask cannot be formed as a single sheet.

Also in the example depicted in FIG. 3, formation of sheet 1b as a single sheet requires that the peripheral channel 5 be divided, thereby connecting the area surrounded by the radial channel 4 and the peripheral channel 5 with the area outside of the peripheral channel 5. Such division of the peripheral channel 5 into portions corresponding to individual radial channels 4, as in the present embodiment, facilitates manufacture of the mounting substrate 1.

A mounting method whereby a semiconductor device is mounted on the mounting substrate discussed above is next described. As shown in FIGS. 4A–4C, this embodiment uses flip-chip mounting in the mounting of a semiconductor device, and the semiconductor device 10 is furnished with projecting electrodes 11 formed from solder or the like.

As shown in FIG. 4A, a liquid or paste-form heat-curing adhesive 12 is applied at the approximate center of the mounting surface of the semiconductor device 10. The semiconductor device 10 to which the adhesive 12 has been applied is placed on the mounting area 3 of the mounting substrate 1 with the mounting surface face down. At such time, each projecting electrode 11 on the semiconductor device 10 makes contact with a corresponding land 2 formed within the mounting area 3 of the mounting substrate 1. The adhesive 12 applied to the semiconductor device 10 is also disposed between the mounting surface of the semiconductor device 10 and the surface of the mounting substrate 1.

The adhesive applied to the approximate center of the semiconductor device 10 is deposited in a gap between the mounting substrate 1 and the mounting surface of the semiconductor device 10, pressure is applied to the semiconductor device 10, and the adhesive flows toward the periphery of the semiconductor device 10; i.e., toward the periphery of the mounting area 3. At such time, the adhesive 12 first advances within the individual radial channels 4 and then flows in an expanding fashion from the radial channels 4 toward the periphery of the channels. The adhesive 12 is thus deposited in the gap between the semiconductor device and the mounting substrate 1 and flows from the center of the semiconductor device 10 toward its periphery.

In the present embodiment, the radial channels 4 extend from the center of the mounting area 3 toward its periphery, and the adhesive 12 applied at the center of the semiconductor device 10 is guided in the radial channels 4 and flows efficiently toward the periphery of the mounting area 3. The radial channels 4 extending toward the four corners of the semiconductor device 10, i.e., the radial channel 4 extending along the diagonals of the mounting area 3, also affords a swift and easy flow of the adhesive 12 from the central region toward the distant four corners. Thus, the adhesive 12 can be made to travel reliably toward the four corners of the semiconductor device 10, and the four corners and periphery of the semiconductor device, often lacking adhesive in the past, can be affixed reliably by the adhesive.

In particular, provision of radial channels 4 directly beneath the four corners of the semiconductor device affords a structure able to withstand any concentration of stress on the four corners. Heat stress caused by change in ambient temperature is concentrated at the four corners of the semiconductor device, and an adhesive often peels away from the four corners, often destroying electrical connections near the four corners too. However, the fact that the radial channels 4 extend directly beneath the four corners of the semiconductor device increases adhesive strength at the four corner areas imparted by the adhesive 12 present in the radial channel 4 and prevents peeling of the adhesive.

The tips of the radial channels 4 extend from the mounting area 3 to the outside and communicate with the peripheral channel 5, the radial channels 4 extend radially from the center of the mounting area 3 toward its periphery, and the tips of the radial channels 4 are always open to the atmosphere. Thus, the adhesive 12 flowing from the center of the mounting area 3 toward its periphery does not enclose air within the radial channels 4, preventing the consequent formation of a void.

Next, as shown in FIG. 4B, a heat press-bonding tool 13 is impressed upon the semiconductor device 10, the semiconductor device 10 is heated, and the projecting electrodes 11 of the semiconductor device 10 are pressed onto the lands 2 of the mounting substrate 1. This heating and pressure bonds the projecting electrodes 11 of the semiconductor device 10 to the lands 2. At such time, the heat press-bonding tool 13 also heats the adhesive 12 indirectly by way of the semiconductor device 10.

The fluidity of the heated adhesive 12 is increased, and the adhesive 12 flows further along the radial channels 4 toward the periphery of the semiconductor device 10 and the periphery of the mounting area 3 and travels over the surface of the mounting substrate 1 and the entire mounting surface of the semiconductor device 10. Adhesive 12 flowing beyond the periphery of the semiconductor device 10 flows into the peripheral channel 5, thereby preventing outflow of adhesive 12 beyond the peripheral channel 5. Because the peripheral channel 5 can store a certain quantity of adhesive 12, the adhesive 12 can be made to travel evenly over the entire mounting surface of the semiconductor device 10 by adjusting the quantity of adhesive 12 supplied to be somewhat copious and letting excess adhesive 12 collect in the peripheral channel 5.

FIGS. 5A–5C illustrate the effect of the peripheral channel 5. The amount of the supplied adhesive 12 is adjusted so that a certain quantity flows to the outside of the semiconductor device 10. The adhesive 12 that flows to the outside of the semiconductor device 10 creeps up over the sides of the semiconductor device 10 to some extent and covers the vertices between the sides of the semiconductor device 10 and the mounting surface. The adhesive 12 thereby reinforces the vertices against external forces and heat stress.

As shown in FIG. 5A, adhesive 12 flowing out to the periphery of the semiconductor device 10 creeps up the sides of the semiconductor device 10 and is also contained in the peripheral channel 5. When a large quantity of adhesive 12 flows out, the majority of the adhesive 12 flowing out is stored in the peripheral channel 5, and as shown in FIG. 5B, the height to which the adhesive 12 creeps up the sides of the semiconductor device 10 does not change appreciably. When the quantity of adhesive 12 flowing out increases further, as shown in FIG. 5C, the adhesive 12 overflows from the peripheral channel S, and the height of the adhesive 12 creeping up the sides of the semiconductor device 10 rises.

If the adhesive 12 climbs up the sides of the semiconductor device 10 and reaches the upper surface of the device, the adhesive 12 can adhere to the heat press-bonding tool 13, shown in FIGS. 4A–4C, and create a problem. Thus, the amount of adhesive 12 supplied is adjusted to a quantity whereby an overflow of adhesive 12 climbs up the sides of the semiconductor device 10 appropriately but does not reach the upper surface of the device. The peripheral channel 5 continues to store the adhesive 12 flowing out and serves to maintain a certain height to which the adhesive 12 climbs on the sides of the semiconductor device 10. Thus, according to the present embodiment, the mounting substrate 1 imparts a certain margin to the amount of adhesive supplied and prevents problems attributable to discrepancies in the amount of adhesive supplied.

As shown in FIG. 4C, once the adhesive 12 travels evenly over the mounting surface of the semiconductor device 10, the adhesive 12 is cured by heat from the heat press-bonding tool 13 and completes the mounting of the semiconductor device 10.

As described above, radial channels 4 are present in the mounting area 3 which comprises an adhesion surface directly facing a semiconductor device 10. The contact surface area between the mounting substrate 1 and the adhesive 12 is thus increased by the side surfaces of the radial channels 4, and the anchoring effect of adhesive 12 that cures within the radial channels 4 increases the adhesive force between the adhesive 12 and the mounting substrate 1, raising the reliability of mounting.

Figure 6A:
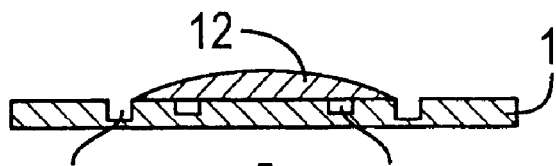
FIGS. 6A–6C are schematic views illustrating another method wherein a semiconductor device is mounted on a mounting substrate according to a first embodiment of the present invention.
Figure 6B:
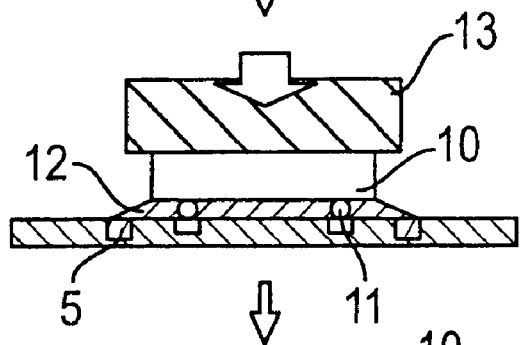
Figure 6C:
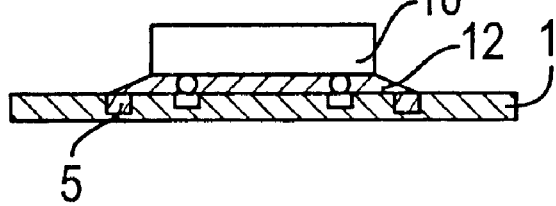

FIGS. 6A–6C illustrate another method for mounting a semiconductor device 10 on a mounting substrate 1 according to a preferred embodiment of the invention. In the mounting method illustrated in FIGS. 6A–6C, an adhesive 12 is applied on the mounting substrate 1, and not on the semiconductor device 10. As shown in FIGS. 6A–6C, the adhesive 12 is supplied at the center of the mounting area 3, on the mounting substrate 1. The semiconductor device 10 is then placed on the mounting area 3 and heated and pressed by a heat press-bonding tool 13. As shown in FIG. 6C, the adhesive 12 is cured by heat from the heat press-bonding tool 13.

The method illustrated in FIGS. 6A–6C also obtains an effect similar to that provided by the radial channels 4 and the peripheral channel 5 in the mounting method illustrated by FIGS. 4A–4C, described above.

Figure 7:
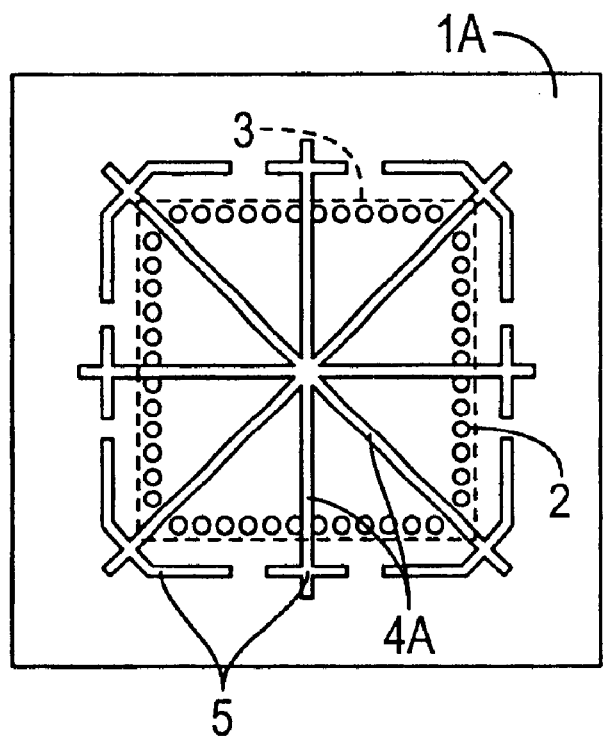
FIG. 7 is a plane view of a mounting substrate according to a second embodiment of the present invention.

A mounting substrate according to a second embodiment of the present invention is next described with reference to FIG. 7. FIG. 7 is a plane view of a mounting substrate 1A according to the second embodiment of the present invention. In FIG. 7, components identical to structural components described in FIG. 1 are assigned the same reference numbers, and a description thereof is omitted.

As FIG. 7 shows, the mounting substrate 1A according to the second embodiment of the present invention has a structure similar to that of the mounting substrate 1 according to the first embodiment of the present invention, the difference being that the tips of radial channels 4A extend outward beyond a peripheral channel 5.

The structure whereby the tips of the radial channels 4A extend outward beyond the peripheral channel 5 imparts a further smooth flow to the adhesive 12 and allows the adhesive 12 to further travel readily over the entire mounting area 3.

Figure 8:
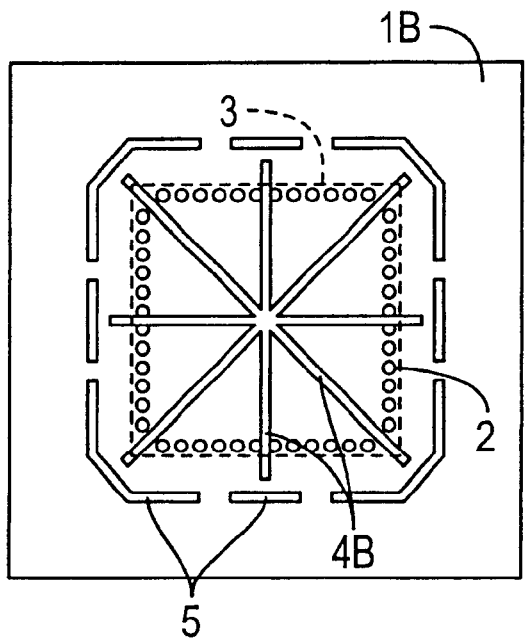
FIG. 8 is a plane view of a mounting substrate according to a third embodiment of the present invention.

A mounting substrate according to a third embodiment of the present invention is next described with reference to FIG. 8. FIG. 8 is a plane view of a mounting substrate 1B according to the third embodiment of the present invention. In FIG. 8, components identical to structural components described in FIG. 1 are assigned the same reference numbers, and a description thereof is omitted.

As FIG. 8 shows, the mounting substrate 1B according to the third embodiment of the present invention has a structure similar to that of the mounting substrate 1 according to the first embodiment of the present invention, the difference being that the tips of radial channels 4B are not continuous with the peripheral channel 5 and terminate before reaching the peripheral channel 5.

The structure whereby the tips of the radial channels 4B terminate before reaching the peripheral channel 5 results in collection of adhesive 12 flowing through the radial channels 4B near the peripheral end of the radial channels 4B, and the amount of adhesive at those areas is greater than at other areas. Specifically, the radial channels 4B located atop the diagonals of the mounting area 3 correspond to the four corners of a semiconductor device, and adhesive 12 is supplied copiously to the tips of the radial channels 4B located atop the diagonals, thereby increasing the reinforcing effect on the four corners of a semiconductor device.

Figure 9:
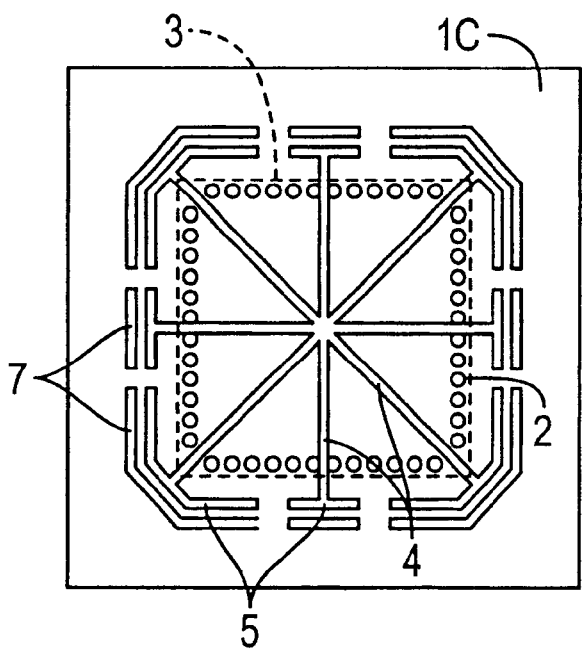
FIG. 9 is a plane view of a mounting substrate according to a fourth embodiment of the present invention.

A mounting substrate according to a fourth embodiment of the present invention is next described with reference to FIG. 9. FIG. 9 is a plane view of a mounting substrate 20 according to the fourth embodiment of the present invention. In FIG. 9, components identical to structural components described in FIG. 1 are assigned the same reference numbers, and a description thereof is omitted.

As FIG. 9 shows, the mounting substrate IC according to the fourth embodiment of the present invention has a structure similar to that of the mounting substrate 1 according to the first embodiment of the present invention, the difference being that a second peripheral channel 7 is also furnished at the outside of a first peripheral channel 5.

The second peripheral channel 7 is formed parallel to the first peripheral channel 5 and to the outside thereof and contains any adhesive 12 that flows outward beyond the first peripheral channel 5. Problems resulting from outflow of adhesive 12 are thus prevented even more reliably, and the quantitative margin for supply of adhesive 12 is further enlarged.

In summary, in a first embodiment of the invention, there is provided a mounting substrate having a mounting area to which a semiconductor device is mounted and affixed by an adhesive. The mounting substrate includes a peripheral channel formed so as to surround the mounting area, and a radial channel extending radially from the center of the mounting area towards the periphery, the tip of the radial channel extending to the outside of the mounting area.

In a second embodiment of the invention, there is provided a mounting substrate wherein the aforementioned peripheral channel and the aforementioned radial channel are formed by removing portions of a solder resist layer formed on the surface of the substrate proper.

In a third embodiment of the invention, there is provided a mounting substrate wherein the aforementioned peripheral channel and the aforementioned radial channel are formed by attaching to the substrate proper a sheet which is of the same material as the material of the substrate proper and which has slits corresponding to a peripheral channel and a radial channel.

In a fourth embodiment of the invention, there is provided a mounting substrate which is similar to any one of the first through the third embodiments and which adopts a structure wherein the mounting area is an approximate square shape corresponding to the shape of a semiconductor device, and the aforementioned radial channel includes a channel extending atop a diagonal of the aforementioned mounting area.

In a fifth embodiment of the invention, there is provided a mounting method for mounting a semiconductor device on a mounting substrate according to any one of the first through the fourth embodiments and wherein an adhesive is applied to at least either the center of the mounting surface of the semiconductor device or the center of the mounting area of the mounting substrate, wherein said semiconductor device then is placed on the mounting area, and wherein the adhesive is cured.

The above-described embodiments of the invention act as further described below.

According to the first embodiment, a radial channel is provided which extends radially from the center of the mounting area. Thus, an adhesive supplied at the center of the mounting area is guided in the radial channel and flows toward the periphery of the mounting area. The adhesive flows completely and uniformly from the center toward the periphery, and disparities in adhesive deposition are eliminated.

In addition, a peripheral channel is furnished at the tip area of the radial channel. Thus, adhesive flowing out from a semiconductor device is contained in the peripheral channel and prevented from further outflow to the outside. A certain amount of the outflowing adhesive is reserved in the peripheral channel. Thus, a certain margin is imparted to the amount of adhesive supplied, and even if the amount of adhesive supplied is inconsistent, adhesive is forced to travel over the entire mounting area, and excess outflow of adhesive is nonetheless prevented.

In addition, because the adhesive cures without further change after the adhesive is deposited in the radial channel, the adhesive force of side wall portions of the radial channel is increased, and the anchoring effect of the adhesive which has cured within the radial channel increases the adhesive force between the adhesive and the mounting substrate. More reliable mounting without peeling of the adhesive is thereby achieved.

According to the second embodiment, a solder resist layer is used to form a radial channel and a peripheral channel. Thus, a solder resist layer, which is used when the electrodes of a semiconductor device are bonded by solder to the lands of a mounting substrate, can also be used at such time to form a radial channel and a peripheral channel by etching or the like.

According to the third embodiment, a peripheral channel and a radial channel are formed by attaching to a substrate proper a sheet material which is the same as that of the substrate proper and has slits corresponding to a peripheral channel and a radial channel. Thus, a peripheral channel and a radial channel are formed easily. In addition, because the sheet material is the same material as that of the substrate proper, their coefficients of thermal expansion are equivalent, and the occurrence of heat stress from ambient temperature change is minimized.

According to the fourth embodiment, a radial channel extends directly beneath the four corner portions of a semiconductor device, and adhesive strength is increased by the effect of the adhesive within the radial channel at the four corner portions, where adhesives peel readily.

According to the fifth embodiment, an adhesive is deposited in a radial channel and made to flow uniformly to the periphery of a mounting area simply by supplying an adhesive at the center of the mounting area. As a result, the adhesive is made to travel over the entire mounting surface of the semiconductor device, and highly reliable mounting is achieved.

Although preferred embodiments of the present invention have been shown and described, it will be appreciated by those skilled in the art that changes may be made in these embodiments without departing from the principle and sprit of the invention, the scope of which is defined in the appended claims and their equivalents.

What is claimed is:

1. A mounting substrate comprising:

a mounting area to which a semiconductor chip is mounted and affixed by an adhesive;

a peripheral channel formed in the mounting substrate to surround said mounting area; and radial channels extending radially from the center towards the periphery of said mounting area and having tips extending to the outside of said mounting area.

2. The mounting substrate of claim 1, wherein said peripheral channel is divided into a number of short peripheral channel portions, each portion being connected to a corresponding radial channel.

3. The mounting substrate of claim 1, wherein radial channels extending vertically and horizontally are connected to lie at right angles to the peripheral channel.

4. The mounting substrate of claim 1, wherein radial channels extending diagonally are connected to corner portions of the peripheral channel, the corner portions of the peripheral channel, the corner portions being formed to extend in a direction perpendicular to the corresponding diagonally extending radial channel.

5. The mounting substrate of claim 1, wherein the tips of said radial channels extend outwardly beyond said peripheral channel.

6. The mounting substrate of claim 1, wherein the tips of said radial channels terminate before reaching said peripheral channel.

7. The mounting substrate of claim 1, wherein a second peripheral channel is found in the mounting substrate at the outside of said peripheral channel.

8. The mounting substrate of claim 1, wherein said peripheral channel and said radial channels are formed by removing portions of a solder resist layer formed on the surface of said mounting substrate.

9. The mounting substrate of claim 1, wherein said peripheral channel and said radial channels are formed by attaching to said mounting substrate a sheet of material similar to the material of the mounting substrate and having slits corresponding to said peripheral channel and said radial channels.

10. The mounting substrate of claim 1, wherein said mounting area is an approximate square shape corresponding to the shape of a semiconductor chip to be mounted, and said radial channel include radial channels extending diagonally in said mounting area toward corners of said mounting area.

* * * * *